United States Patent
Rauschmayer et al.

(10) Patent No.: US 8,413,029 B2
(45) Date of Patent: Apr. 2, 2013

(54) ERROR CORRECTION CAPABILITY ADJUSTMENT OF LDPC CODES FOR STORAGE DEVICE TESTING

(75) Inventors: Richard Rauschmayer, Longmont, CO (US); Hongwei Song, Longmont, CO (US)

(73) Assignee: LSI Corporation, San Jose, CA (US)

( * ) Notice: Subject to any disclaimer, the term of this patent is extended or adjusted under 35 U.S.C. 154(b) by 1057 days.

(21) Appl. No.: 12/402,359

(22) Filed: Mar. 11, 2009

(65) Prior Publication Data

US 2010/0185906 A1 Jul. 22, 2010

Related U.S. Application Data

(60) Provisional application No. 61/145,152, filed on Jan. 16, 2009.

(51) Int. Cl.
  *H03M 13/03* (2006.01)
  *G11C 29/00* (2006.01)
(52) U.S. Cl. .......... 714/794; 714/774; 714/770
(58) Field of Classification Search .......... 714/758, 714/746, 763, 764, 774, 794
  See application file for complete search history.

(56) References Cited

U.S. PATENT DOCUMENTS

| | | | |
|---|---|---|---|
| 5,942,003 A | 8/1999 | Ivry | |
| 6,823,487 B1 | 11/2004 | Poeppelman | |
| 6,986,075 B2 * | 1/2006 | Ackaret et al. ........ | 714/4.5 |
| 7,068,729 B2 | 6/2006 | Shokrollahi | |
| 7,266,750 B1 * | 9/2007 | Patapoutian et al. ...... | 714/758 |
| 7,689,893 B1 * | 3/2010 | Burd ............... | 714/784 |
| 7,817,363 B2 * | 10/2010 | O'Brien et al. ........ | 360/31 |
| 7,844,877 B2 * | 11/2010 | Litsyn et al. ........ | 714/752 |
| 8,127,209 B1 * | 2/2012 | Zhang et al. ........ | 714/780 |
| 8,171,380 B2 * | 5/2012 | Yang et al. ........ | 714/774 |
| 2005/0229088 A1 | 10/2005 | Tzannes et al. | |
| 2007/0168843 A1 | 7/2007 | Kanaoka et al. | |
| 2007/0180186 A1 | 8/2007 | Cornwell et al. | |
| 2007/0180328 A1 | 8/2007 | Cornwell et al. | |
| 2007/0260966 A1 | 11/2007 | Kim et al. | |
| 2007/0266300 A1 | 11/2007 | Ito et al. | |
| 2008/0022189 A1 * | 1/2008 | Vityaev et al. ........ | 714/770 |
| 2008/0028274 A1 | 1/2008 | Lin | |
| 2008/0115036 A1 | 5/2008 | Kuznetsov et al. | |

(Continued)

FOREIGN PATENT DOCUMENTS

WO WO2007089165 A1 8/2007

OTHER PUBLICATIONS

Gunnam, K.K.; Choi, G.S.; Yeary, M.B.; Shaohua Yang; Yuanxing Lee; , "Next generation iterative LDPC solutions for magnetic recording storage," Signals, Systems and Computers, 2008 42nd Asilomar Conference on , vol., No., pp. 1148-1152, Oct. 26-29, 2008.*

(Continued)

*Primary Examiner* — Cynthia Britt
(74) *Attorney, Agent, or Firm* — Duft Bornsen & Fettig LLP

(57) ABSTRACT

Methods and structure described herein provide for adjusting an error correction capability of an LDPC error correction code. For example, the system of one embodiment includes a decoder adapted to decode data that has been encoded with a LDPC error correction code. The system also includes a detector communicatively coupled to the decoder and adapted to estimate bit values in the data prior to decoding by the decoder. The detector is further adapted to change bit values based on bit value estimations to reduce the error correction capability of the LDPC error correction code. The reduction in error correction capability is adjustable such that sector failure rates of storage devices may be incrementally analyzed.

16 Claims, 4 Drawing Sheets

U.S. PATENT DOCUMENTS

2008/0282128 A1* 11/2008 Lee et al. .................. 714/755
2009/0006931 A1* 1/2009 Djurdjevic et al. ........... 714/799
2010/0192043 A1* 7/2010 Alrod et al. ................. 714/763

OTHER PUBLICATIONS

Duric, N.; Despotovic, M.; Vasic, B.; , "Low-density parity-check codes and iterative decoding for two-track two-head E2PR4 channel," Telecommunications in Modern Satellite, Cable and Broadcasting Service, 2003. TELSIKS 2003. 6th International Conference on , vol. 2, No., pp. 421-424 vol. 2, Oct. 1-3, 2003.*

Mansour, M.M.; Shanbhag, N. R.; , "A novel design methodology for high-performance programmable decoder cores for AA-LDPC codes," Signal Processing Systems, 2003. SIPS 2003. IEEE Workshop on , vol., No., pp. 29-34, Aug. 27-29, 2003.*

Xiong Lei; Tan Zhenhui; Yao Dongping; , "The Moderate-Throughput and Memory-Efficient LDPC Decoder," Signal Processing, 2006 8th International Conference on , vol. 3, No., 16-20 2006.*

John M. Cioffr:"Digital Communication Coding—Chapter 9: Sequence Detection", Standford University Online Repository, Jul. 10, 2006, pp. 66-146, XP002683830, Retrieved from the Internewt URL: Http://www.standford.edu/group/cioffi/book/chap9.pdf [retrieved on Sep. 19, 2012].

Galbarith et al.: "Iterative Detection Read Channel Technology in Hard Disk Drives", Internet Citation URL: http://hitachigst.com/tech/techlib63AE/$file/IDRC_WP_final.pdf [retrieved on Oct. 14, 2010].

* cited by examiner

US 8,413,029 B2

ERROR CORRECTION CAPABILITY ADJUSTMENT OF LDPC CODES FOR STORAGE DEVICE TESTING

RELATED APPLICATIONS

This non-provisional patent application claims priority to and thus the benefit of an earlier filing date from U.S. Provisional Patent Application No. 61/145,152 filed on Jan. 16, 2009, the entire contents of which are incorporated by reference.

BACKGROUND

1. Field of the Invention

Generally, the invention relates to testing storage devices under certain test conditions. More specifically, the invention relates to adjusting an error correction capability of an LDPC code such that the sector failure rate of the storage device can be incrementally determined.

2. Discussion of the Related Art

In many storage devices, data is commonly written to and retrieved from the devices in contiguous blocks. In a disk drive, a read/write channel performs such reading and writing. The read/write channel improves the detection of the data that is written to and read from the hard disk using certain detection algorithms. For example, algorithms like PRML (Partial Response signaling with Maximum Likelihood detection) increase the signal to noise ratio (SNR) of the data being read from the hard disk which increases the likelihood that the data will be read properly. Since correct detection of the data is more likely, these algorithms may allow for the increase of areal densities on the disk (i.e., an increased number of storable bits on the hard disk). As data errors can increase with increased areal density, however, error control coding is used to improve the performance of the detection algorithm. Often, Reed-Solomon codes (RS codes) provide for this error correction capability.

The number of data errors that occurs during a read (i.e., the sector failure rate, or SFR) generally coincides with the SNR of the read signal. Lower SNRs result in greater error rates. Higher SNRs result in lower error rates. The SNR of the read signal has certain limits due to power, componetry, and degradation of the disk drive over time. The data errors that result are thus corrected with the RS code.

Disk drive manufacturers generally establish a code level of "T=20" for the maximum level of correction required to meet the maximum error rates that a disk drive is expected to endure as the hard disk degrades. A T=20 code level requires 20 bits of code for 40 bits of data. During the manufacturing process, the disk drives are tested to ensure that the drives meet some requisite level of error rates for given SNRs. Since the hard disks are new, they are likely to encounter fewer errors than their aging counterparts. However, some new disks will experience an unacceptable number of errors due to inconsistencies in the manufacturing process. To ensure that the disks meet acceptable SFRs for certain SNRs without being recovered by the full T=20 error correction, the code level is "dialed back" to T=5.

Presently, disk drive manufacturers are seeking to employ other codes as areal densities and processing capabilities increase with technological advances. One code presently being implemented is called the Low Density Parity Check (LDPC) code. The LDPC codes are relatively complex and thus computationally intensive. For example, the LDPC codes correct errors in larger contiguous blocks of data than the RS codes and thus require more computations. The LDPC codes are generally capable of correcting more errors than the RS codes and appear to be the heirs apparent in error correction as processing capabilities have significantly increased over time. The LDPC codes, however, do not have the RS code capability of "dialing back" to ensure that manufactured test drives meet some requisite minimum level of SFRs. Thus, there exists a need to reduce the level of LDPC error correction for testing purposes if the LDPC codes are to be used in storage devices.

SUMMARY

The present invention solves the above and other problems, thereby advancing the state of the useful arts, by providing methods and structure for adjusting an error correction capability of a low density parity check error correction code. For example, storage devices generally require testing prior to customer delivery. Previously, the storage devices were tested by dialing back the RS code of the encoded data, as described above. Since the advent of LDPC codes in storage devices, error correction capabilities of the LDPC was essentially at "full scale", requiring the computationally intensive full use of the LDPC while forgoing the ability to establish the SFR of a recently manufactured storage device. A system, in one embodiment, overcomes these limitations by providing a decoder adapted to decode LDPC encoded data. A detector is communicatively coupled to the decoder and adapted to estimate bit values in the data prior to decoding by the decoder. The detector is further adapted to change bit values based on bit value estimations to reduce the error correction capability of the low density parity check error correction code.

Another aspect of the invention regards a method of testing a disk drive that includes encoding data with an LDPC code and storing the encoded data on the disk drive. The method further includes reading the encoded data from the disk drive, estimating bit values in the encoded data, and changing a portion of the bit values in the encoded data based on bit value estimations. The method also includes decoding the encoded data according to the low density parity check code in response to changing said portion of the bit values to determine a sector failure rate in the disk drive.

Another aspect of the invention regards a system adapted to test a disk drive. The system includes a write module adapted to encode data with an LDPC code and write the encoded data to the disk drive. The system also includes a read module adapted to read the encoded data from the disk drive, estimate bit values in the encoded data and change a portion of the bit values based on the bit value estimations. The changed bit values reduce an error correction capability of the low density parity check code to determine a sector failure rate of the disk drive.

DETAILED DESCRIPTION OF THE DRAWINGS

FIGS. 1-4 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
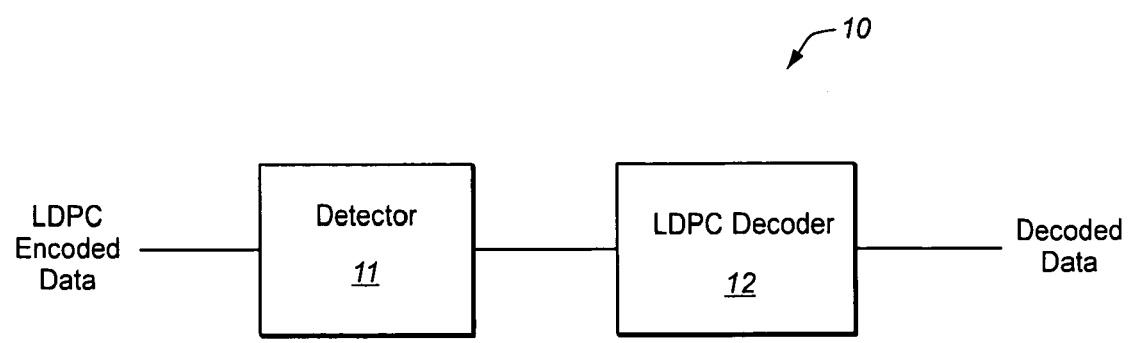
FIG. 1 is an exemplary system for adjusting an error correction capability of an LDPC code.

FIG. 1 is an exemplary system 10 for adjusting an error correction capability of an LDPC code. In this embodiment, the system 10 includes an LDPC decoder 12 that is adapted to decode LDPC encoded data. LDPC codes are codes that, when decoded, approach the "Shannon limit", or the theoretical bound for channel capacity for a given modulation and code rate. That is, Shannon's limit may be viewed as being the data rate to be used in a communication channel, having a particular SNR, that achieves error free transmission through the communication channel.

The LDPC encoded data may be encoded by generating a signal that includes symbols each having a common code rate and being mapped to a singular modulation. That is, the symbols of an LDPC coded modulation signal have the same code rate and the same modulation frequency. Once encoded, the data may be subsequently stored in a storage system such as a disk drive system.

When reading data from the storage system, the LDPC decoder 12 may decode the data based on a bipartite graph of a given LDPC code such that the graph includes both bit nodes and check nodes. The In-phase/Quadrature (I/Q) values associated with received symbols are associated with a symbol node and that symbol node is associated with corresponding bit nodes. Bit metrics are then calculated for the individual bits of the corresponding symbols and those bit metrics are provided to the bit nodes of the bipartite graph of the given LDPC code. Edge information corresponding to the edges that interconnect the bit nodes and the check nodes is calculated, appropriately updated, and communicated back and forth between the bit nodes and the check nodes during iterative decoding of the LDPC encoded signal. The bit metric values that are employed are generally fixed values that are used repeatedly in the iterative decoding process.

Due to the structure of the LDPC codes, the decoder 12 is not readily configurable to change error correction capabilities. That is, the decoder 12 is configured in such a way so as to decode data according to the same LDPC code used to encode the data. Thus, the error correction capabilities of the decoder 12 are generally static, unlike the scalable RS codes. As mentioned, manufacturers generally desire to test storage devices by "dialing back" the error correction capability of a code to approach an expected failure rate of the storage device associated with manufacturing processes. Since the decoder 12 is generally incapable of readily adjusting the error correction capability, the system 10 is configured with the detector 11 that is adapted to estimate bit values in the data prior to decoding by the decoder 12. The detector 11 changes bit values based on bit value estimations, prior to decoding by the decoder 12, to reduce the error correction capability of the LDPC error correction code.

To illustrate, when the decoder 12 receives a valid codeword with bits in error (e.g., degraded to the point which they are unrecognizable), the decoder 12 considers the bits to be missing from the codeword. The decoder 12 responds by correcting the bits using the error correction capabilities of the LDPC code. The system 10 overcomes this error correction capability by having the detector 11 correct the missing bits, or a portion thereof, prior to decoding by the decoder 12 thereby removing the need for the decoder 12 to correct the bits. By having the detector 11 operate on a predetermined interval of bits, the error correction capability of the decoder 12 may, in essence, be "dialed back".

Figure 2:
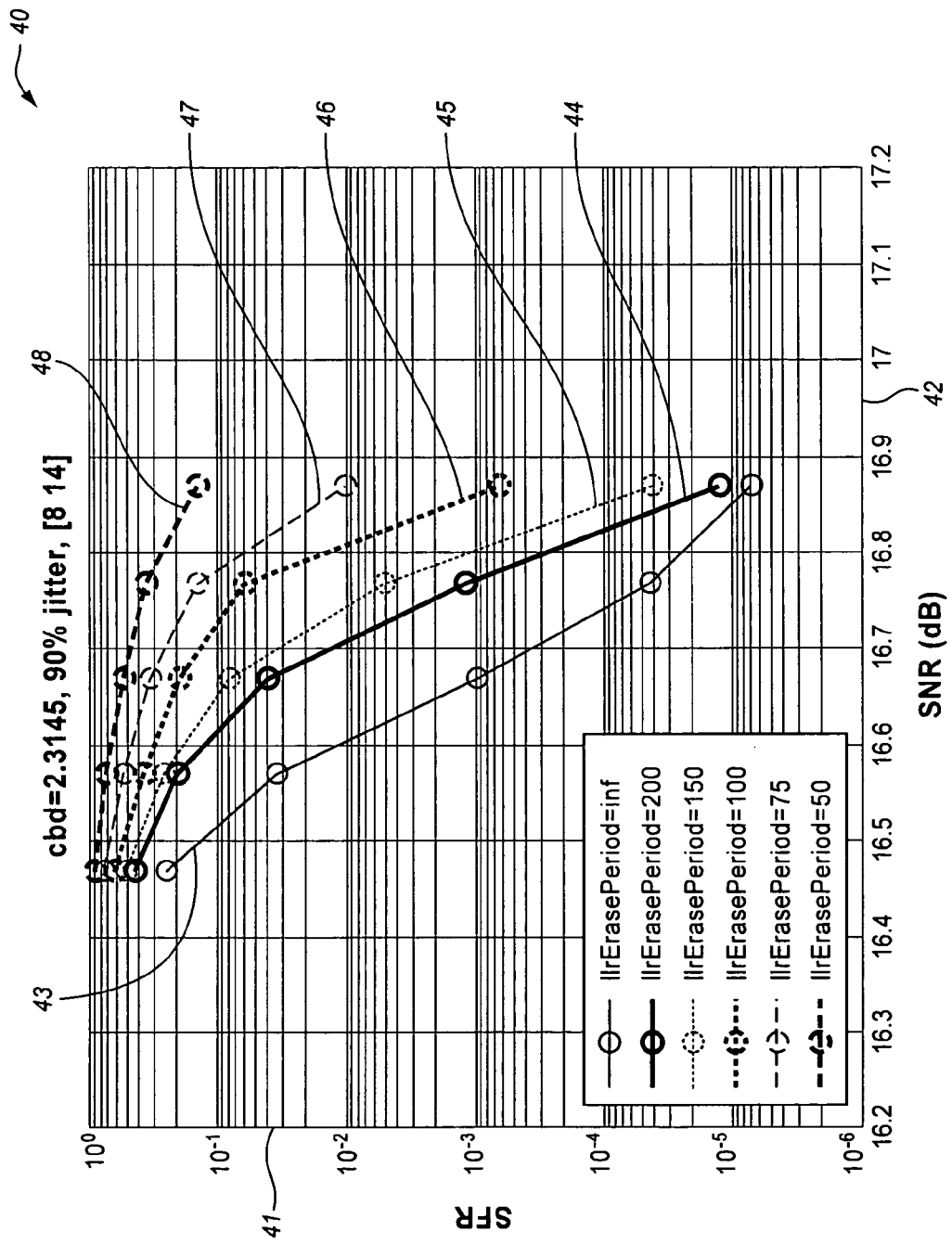
FIG. 2 is a graph illustrating SFR analysis for various LDPC error correction adjustments.

By adjusting the data interval in which the detector 11 corrects bits, the system 10 is capable of analyzing SFRs for various signal-to-noise ratios in a storage system. For example, FIG. 2 is a graph illustrating SFR analysis for various LDPC error correction adjustments. The y-axis 41 illustrates the SFR for a storage device. The SFR of the y-axis 41 is shown in symbol (i.e., 10-bits) errors per LDPC codeword. The x-axis 42 illustrates the SNR of the read signal (i.e., the LDPC encoded data) in decibels. Each of the "steps" 43-48 illustrate a bit interval check performed by the detector 11.

To illustrate, when the detector corrects every $50^{th}$ bit in the LDPC encoded data (i.e., step 48), the SFR decreases as SNR increases; however, it does so at a less dramatic rate as when the LDPC decoder 12 is allowed to decode every bit of the LDPC encoded data, as illustrated in step 43. By removing the ability to correct every bit in the LDPC encoded data, a technician may be able to determine whether a manufactured storage device meets some requisite minimum level of SFR for a given SNR in a manner similar to the RS code dialing back described above. Accordingly, when a storage device is tested by reading data from the device and correcting bits at a particular bit interval, the determined SFR may be used to qualify the storage device for customer use.

In one embodiment, the detector 11 employs a soft output Viterbi algorithm (SOVA). A SOVA differs from the classical Viterbi algorithm in that it uses a modified path metric, which takes into account known probabilities of input symbols and produces a soft output indicating the reliability of the decision. For example, detector 11 may estimate the log likelihood ratio (LLR) at a particular bit interval to establish the bit value at that bit interval. When a possible error is detected, the detector 11 may estimate whether the bit is either a one or a zero. Detection of the present invention, however, is not intended be limited to SOVA as other detection algorithms may be used to estimate the probability of a particular received bit.

Figure 3:
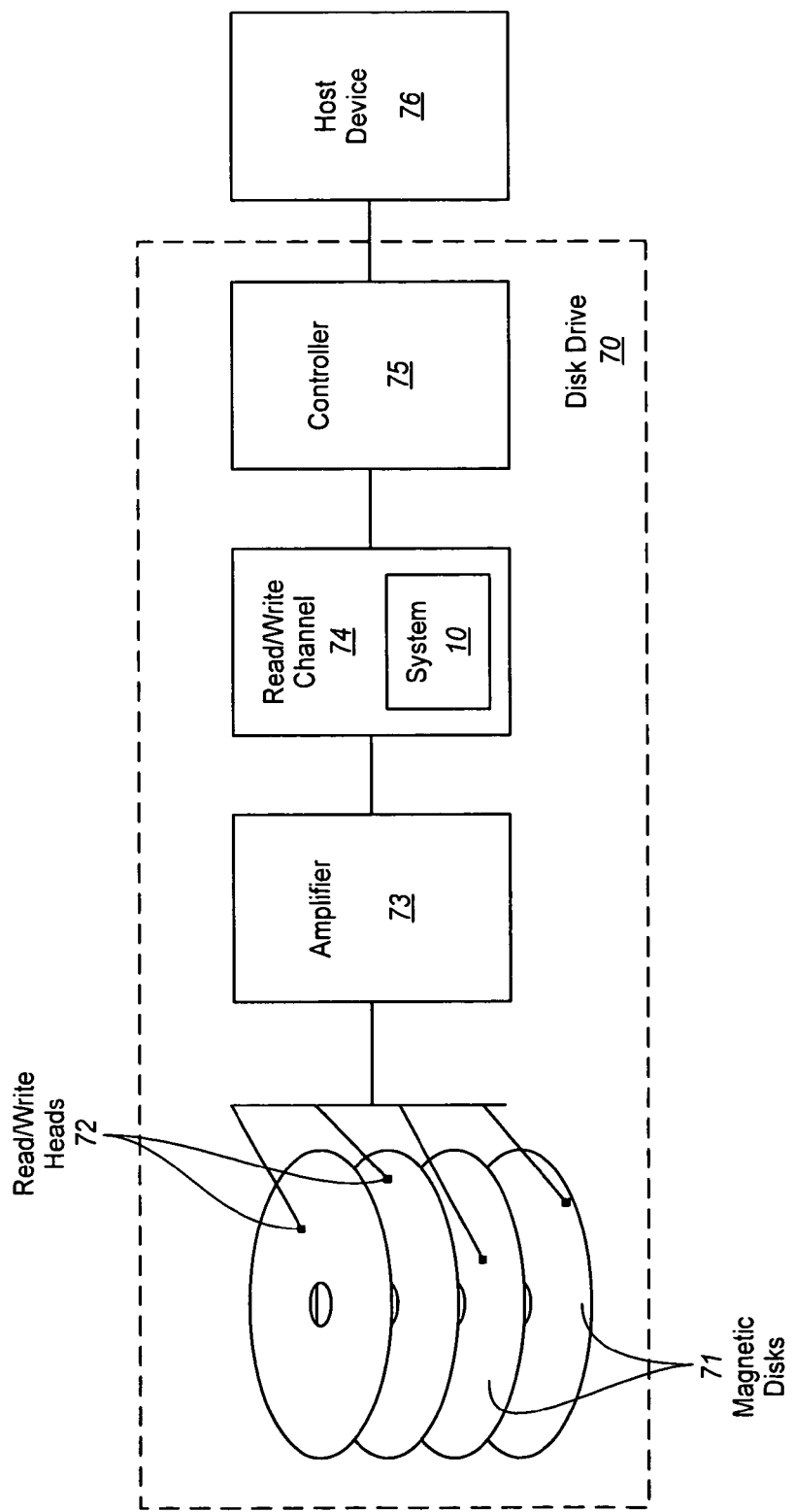
FIG. 3 is an example of the system of FIG. 1 implemented with a disk drive.

FIG. 3 represents a block diagram of a disk drive 70 having a read/write channel 74 employing the system 10 of FIG. 1. In this embodiment, the read/write heads 72 are operatively disposed adjacent to the magnetic disks 71 to magnetically record (i.e., write) data onto the magnetic disks 71 from the host device 76. The read/write heads 72 also sense magnetic flux reversals on the magnetic disks 71 to read from the magnetic disks 71 and transfer data to the host device 76. To write data onto the magnetic disks 71, the host device 76 provides the controller 75 with a data signal and the location (e.g., a sector address of the magnetic disks 71) to write the data signal on the magnetic disks. The controller 75 directs the read/write heads 72 to move into the proper location and transfers the data signal to the read/write channel 74. The read/write channel 74 LDPC encodes the data signal and converts it to analog signals. The read/write channel 74 transfers the analog signals to the amplifiers 73 for amplification. The amplifiers 73 then transfer the amplified analog signals to the read/write heads 72. The read/write heads 72 impart magnetic flux reversals onto the magnetic disks 71 representative of the data signal. The read/write channel 74 may control the magnetic flux reversals via peak detection, PRML encoding, or the like.

Generally, to read data from the magnetic disks 71, the host device 76 provides a location identifier, or sector address of the magnetic disk 71, to the disk drive 70. The controller 10 receives the location identifier and determines the physical location of the data on the disks 71. The controller 75 directs one or more of the read/write heads 72 to move into the proper position for the data on the magnetic disks 71 to spin adjacent to the read/write heads 72. As the magnetic disks 71 spin, the read/write heads 72 sense the presence or absence of flux reversals on the magnetic disks 71. The read/write heads generate an analog signal in response to the flux reversals. The read/write heads 72 transfer the analog signal to the amplifiers 73, which amplify and convey the analog signal to the read/write channel 74. The read/write channel 74 decodes the amplified analog signal into a binary digital data signal via peak detection, PRML decoding, or the like. The read/write channel 74 transfers the data signal to the controller 75, which subsequently transfers the data signal to the host device 76.

The read/write channel 74, in this embodiment, includes the system 10 FIG. 1 so as to reduce the error correction capability of the LDPC code used to originally encode the data signal. That is, when the data is read from the magnetic disks 71, the system 10 detects missing bits in LDPC codewords and corrects them prior to being decoded by the LDPC decoder (e.g., the LDPC decoder 12). Since the missing bits have been corrected, the system 10 bypasses the LDPC decoding of those bits and thereby reduce the effectiveness of the LDPC decoder.

Although shown and described with respect to the system 10 being implemented with the disk drive 70, the invention is not intended to be so limited. Rather, the system 10 may be implemented in any device employing LDPC codes where it is desired to have the error correction capability of the LDPC code "dialed back". For example, LDPC codes may be used to encode data for storage on flash memory devices. Accordingly, when manufacturers wish to test the SFRs of the flash memory devices before customer delivery, the LDPC code error correction capability may be dialed back in a similar manner. Nor is the invention intended to be limited to implementation with the read/write channel 74. For example, the system 10 may be implemented as hardware, software, firmware, or combinations thereof in almost any device where the error correction capabilities of the LDPC code require dialing back. In this regard, the system 10 may be implemented with the controller 75 or even the host device 76.

Figure 4:
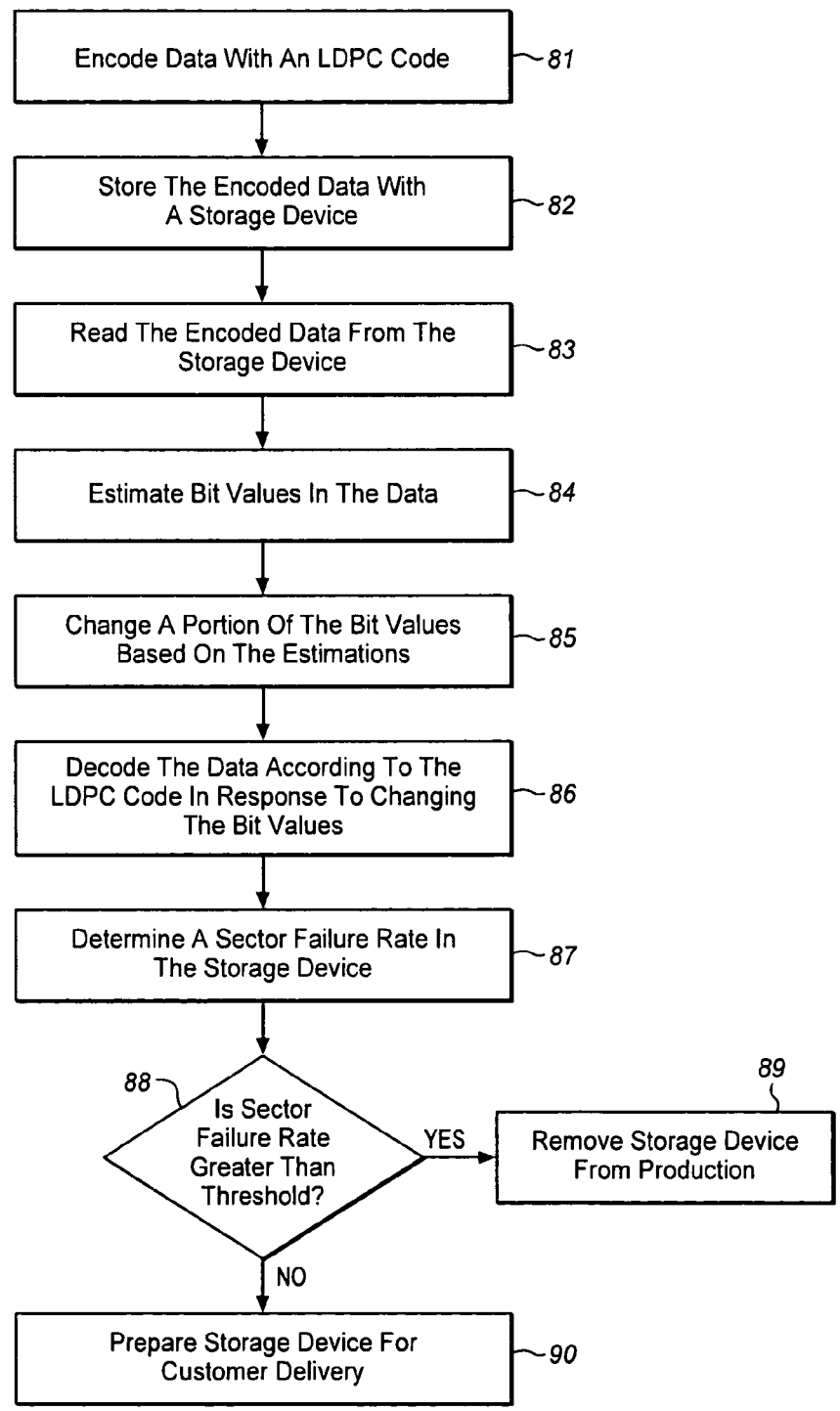
FIG. 4 is an exemplary flow chart of a method for testing a storage device.

FIG. 4 is an exemplary flow chart of a method 80 for testing a storage device. In this embodiment, data is first encoded with an LDPC code in the process element 81 and the encoded data is then stored with the storage device in the process element 82. The storage device may be any storage device capable of storing digital data, such as a disk drive, a flash memory drive, an optical drive (e.g., CD-ROM), etc. More particularly, any storage device may be used where it is technologically feasible to employ LDPC codes for data storage.

The LDPC encoded data is read from the storage device, in the process element 83. In one particular embodiment, a read head in a disk drive may detect magnetic flux reversals on a magnetic disk of the disk drive to form an analog signal that is subsequently converted to a digital signal (i.e., digital data). Then, prior to decoding LDPC encoded data, bit values in the data are estimated, in the process element 84. For example, a detector may periodically analyze bits in the read datastream to determine possible errors in the data. More particularly, the detector may be a SOVA detector that estimates the LLR at a particular bit interval to establish the bit value at that bit interval. When a possible error is detected, the detector may estimate whether the bit is either a one or a zero. Accordingly, when these possible errors are detected at the bit intervals, the detector may change a portion of the bit values based on the bit value estimations, in the process element 85. Thereafter, the data may be decoded according to the LDPC code, in the process element 86. For example, an LDPC decoder may decode the data according to the LDPC code used to encode the data. Because various errors were previously estimated and corrected via the detector, the error correction capability of the LDPC code is thereby reduced, or "dialed back".

The decoder while decoding the LDPC encoded data may determine a SFR with a storage device, in the process element 87. For example, even with certain bit errors being estimated and corrected in the data via the detector, errors are still likely to occur in the read data. The decoder may accumulate statistics regarding the number of errors that are corrected relative to the overall read data during the LDPC decoding process. Thus, the decoder may determine a bit error rate, or SFR, in the read data. Generally, since the detector is correcting a portion of the read data prior to decoding by the decoder, the SFR is likely to decrease. However, the SFR in a relatively new device is likely to be fairly low. Accordingly, the scaling back of the LDPC error correction capability allows a technician to observe SFRs that are generally associated with manufacturing inconsistencies. In this regard, the method 80 may continue by determining whether the SFR is greater than a threshold, in the process element 88. If so, the storage device may be removed from production (e.g., for refurbishing, destruction, etc.), in the process element 89. Otherwise, the storage device may be readied for customer delivery, in the process element 90.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A system for adjusting an error correction capability of a low density parity check error correction code, the system comprising:
   a decoder configured to decode data utilizing likelihood estimates of bit values in the data, wherein the data is encoded with a low density parity check error correction code; and
   a detector communicatively coupled to the decoder and configured to calculate the likelihood estimate of one or more bit values in the data prior to decoding by the decoder, wherein the detector is further configured to reduce the likelihood estimate of the one or more bit values to reduce the error correction capability of the decoder.

2. The system of claim 1, wherein the detector comprises a soft output Viterbi algorithm.

3. The system of claim 1, wherein the decoder and the detector are configured within a read module of a disk drive.

4. The system of claim 1, wherein the reduced error correction capability increases a measured sector failure rate in a disk drive manufacturing process.

5. The system of claim 1, wherein the detector is further configured to establish a log likelihood ratio during said likelihood estimate of the one or more bit values.

6. The system of claim 1, wherein the decoder is further configured to analyze the sector failure rate of the storage device in response to decoding the data.

7. The system of claim 1, wherein the detector is further configured to calculate the likelihood estimate at a predetermined bit interval in the data.

8. A method of testing a disk drive, the method comprising:
encoding data with a low density parity check code;
storing the encoded data on the disk drive;
reading the encoded data from the disk drive;
calculating a likelihood estimate of one or more bit values in the encoded data;
reducing the likelihood estimate of the one or more bit values in the encoded data to decrease an error correction capability of the low density parity check code; and
decoding the encoded data utilizing the low density parity check code and likelihood estimates of bit values in the encoded data to determine a sector failure rate in the disk drive.

9. The method of claim 8, wherein calculating the likelihood estimate comprises performing said calculating on a recurring number of bits in the data.

10. The method of claim 8, wherein calculating the likelihood estimate of the one or more bit values in the encoded data comprises performing a soft output Viterbi algorithm on the one or more bit values to establish an log likelihood ratio for the one or more bit values.

11. The method of claim 8, wherein the reduced error correction capability increases a measured sector failure rate in a disk drive manufacturing process.

12. A system configured to test a disk drive, the system comprising:
a write module configured to encode data with a low density parity check code and configured to write the encoded data to the disk drive; and
a read module configured to read the encoded data from the disk drive, configured to calculate a likelihood estimate of one or more bit values in the encoded data, and configured to reduce the likelihood estimate of the one or more of the bit values in the encoded data, wherein the reduced likelihood estimate of the one or more bit values in the encoded data reduces an error correction capability of the low density parity check code to determine a sector failure rate of the disk drive.

13. The system of claim 12, wherein the read module comprises:
a decoder configured to decode the encoded data utilizing the low density parity check code and a likelihood estimate of bit values in the encoded data; and
a detector communicatively coupled to the decoder and configured to calculate the likelihood estimate of the one or more bit values in the encoded data prior to decoding by the decoder using a soft output Viterbi algorithm.

14. The system of claim 13, wherein the detector is further configured to establish a log likelihood ratio of the one or more bit values in the encoded data.

15. The system of claim 13, wherein the decoder is further configured to analyze the sector failure rate of the storage device in response to decoding the data.

16. The system of claim 13, wherein the detector is further configured calculate the likelihood estimate on a predetermined bit interval in the data.

\* \* \* \* \*